(12) United States Patent
Yang

(10) Patent No.: US 8,249,537 B2
(45) Date of Patent: Aug. 21, 2012

(54) NOISE CANCELLATION CIRCUIT FOR A MIXER DEVICE AND RELATED MIXER DEVICE

(75) Inventor: Chih-Hsun Yang, Changhua County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 893 days.

(21) Appl. No.: 12/267,614

(22) Filed: Nov. 9, 2008

(65) Prior Publication Data
US 2010/0056094 A1    Mar. 4, 2010

(30) Foreign Application Priority Data
Sep. 1, 2008    (TW) .............................. 97133464 A

(51) Int. Cl.
*H04B 1/10* (2006.01)

(52) U.S. Cl. ........ 455/296; 455/323; 455/326; 327/113; 327/355

(58) Field of Classification Search .................. 455/296, 455/323, 326; 327/113, 355
See application file for complete search history.

(56) References Cited

U.S. PATENT DOCUMENTS
2004/0214547 A1* 10/2004 Kim et al. ..................... 455/296
* cited by examiner

*Primary Examiner* — John Poos
(74) *Attorney, Agent, or Firm* — Winston Hsu; Scott Margo

(57) ABSTRACT

A noise cancellation circuit for a mixer device includes a first signal terminal, coupled to a first output terminal, and a second signal terminal, coupled to a second output terminal of the RF input stage of the mixer device, a first variable current source with a first end coupled to the first signal terminal, a second end coupled to the second signal terminal, and a third end coupled to a first voltage source, a second variable current source with a first end coupled to the second signal terminal, a second end coupled to the first signal terminal, and a third end coupled to the first voltage source, and a phase shift device coupled to the first signal terminal and the second end of the second variable current source, transforming a first signal into a second signal, and outputting to the second end of the second variable current source.

56 Claims, 14 Drawing Sheets

NOISE CANCELLATION CIRCUIT FOR A MIXER DEVICE AND RELATED MIXER DEVICE

BACKGROUND OF THE INVENTION

1. Field of the Invention

The present invention is related to a noise cancellation circuit for a mixer device and related mixer device, and more particularly to a noise cancellation circuit and related mixer device which can greatly reduce the flicker noise and increase the quality of the received information.

2. Description of the Prior Art

The mixer is a critical component in a wireless communication system, which is used for frequency translation which includes moving signals upward or downward in the frequency domain. According to the prior art, the mixer using the direct conversion architecture has the benefits of lower cost, lower energy consumption and higher degree of integration, and the Gilbert double-balanced mixer is one of the frequently used examples.

Please refer to FIG. 1, which illustrates a Gilbert double-balanced mixer 10. The Gilbert double-balanced mixer 10 comprises an RF (radio-frequency) input stage circuit 100, a mixer circuit 102 and an output stage circuit 104. The RF input stage circuit 100 comprises the field effect transistors M1 and M2, whose gates are used for receiving the differential RF signal VRF+ and VRF− from the antenna or the low noise amplifier (LNA), and the drains of the transistors are used for generating the corresponding differential current IRF+ and IRF−. The mixer circuit 102 comprises the field effect transistors M3, M4, M5 and M6, and is used for performing the function of frequency-mixing. The working principles behind the frequency-mixing process is to control the gains of the field effect transistors M3, M4, M5 and M6 by varying the magnitude of the currents IRF+ and IRF−, which are originated from drains of the transistors M1 and M2. Therefore, when the differential LO signal VLO+ and VLO− varies, the mixer circuit 102 will output the differential currents IIF+ and IIF− to the output stage circuit 104, which comprises the multiplication result of the gate voltages VLO+ and VLO− (of transistors M3-M6) and the drain current IRF+ and IRF− (of transistors M1-M2). Finally, the output stage circuit 104 comprises the resistors R1 and R2, which transfers the differential current IIF+ and IIF− to a differential low-frequency signal VIF+ and VIF−. In other words, the differential low frequency signal VIF+ and VIF− can be considered as the multiplication result of the differential RF signal (VRF+ and VRF−), and the differential LO signal (VLO+ and VLO−).

Inside the Gilbert double-balanced mixer 10, the four field effect transistor (M3-M6) of the mixer circuit 102 can generate the flicker noise owing to some of their intrinsic characteristics and the parasitic capacitance associated with the source of the transistors (M3-M6). The emergence of the flicker noise will greatly reduce the signal-to-noise ratio of the receiver circuit, and degrades the system performance. The frequency spectrum of the flicker noise overlaps with the frequency spectrum of the real signal, such that the flicker noise can't be removed simply by some frequency selective filtering process. Meanwhile, the frequency response of the flicker noise is approximately inversely proportional to the frequency; the energy of the flicker noise will get larger as the frequency goes lower. In other words, the real signals with some of their frequency components located close to the dc (direct current) will be seriously affected by the flicker noise. Therefore, for the purpose of increasing the quality of the received signals and decreasing the error rate of the received information, it is a must for the receiver circuit to decrease the influence of the flicker noise to the real signals.

SUMMARY OF THE INVENTION

It is therefore a primary objective of the claimed invention to provide a noise cancellation circuit for a mixer device and its related mixer device.

The present invention discloses a noise cancellation circuit for a mixer device which comprises a first signal terminal, coupled to a first output terminal of an RF input stage of the mixer device, a second signal terminal, coupled to a second output terminal of the RF input stage of the mixer device, a first variable current source comprising a first end coupled to the first signal terminal, a second end coupled to the second signal terminal, and a third end coupled to a first voltage source, for adjusting current from the first end to the third end according to signals of the second end, a second variable current source comprising a first end coupled to the second signal terminal, a second end coupled to the first signal terminal, and a third end coupled to the first voltage source, for adjusting current from the first end to the third end according to signals of the second end, and a phase shift device coupled to the first signal terminal and the second end of the second variable current source, for transforming a first signal into a second signal, and outputting to the second end of the second variable current source.

The present invention also discloses a mixer device capable of reducing the noise which comprises an RF input stage which further comprises a first input terminal, a second input terminal, a first output terminal and a second output terminal, and is used for receiving a differential input signal, and outputting a front stage differential signals via the first output terminal and the second output terminal, a mixer circuit coupled to the first output terminal and the second output terminal, and is used for receiving the front stage signals, and performing the multiplication operation between the front stage differential signal and the differential oscillation signals, and outputting a differential multiplication signal, an output stage coupled to the mixer circuit, and is used for generating a differential low frequency signal according to the differential multiplication signal, and a noise cancellation circuit which further comprises a first signal terminal, coupled to a first output terminal of an RF input stage of the mixer device, a second signal terminal, coupled to a second output terminal of the RF input stage of the mixer device, a first variable current source comprising a first end coupled to the first signal terminal, a second end coupled to the second signal terminal, and a third end coupled to a first voltage source, for adjusting current from the first end to the third end according to signals of the second end, a second variable current source comprising a first end coupled to the second signal terminal, a second end coupled to the first signal terminal, and a third end coupled to the first voltage source, for adjusting current from the first end to the third end according to signals of the second end, and a phase shift device coupled to the first signal terminal and the second end of the second variable current source, for transforming a first signal into a second signal, and outputting to the second end of the second variable current source.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
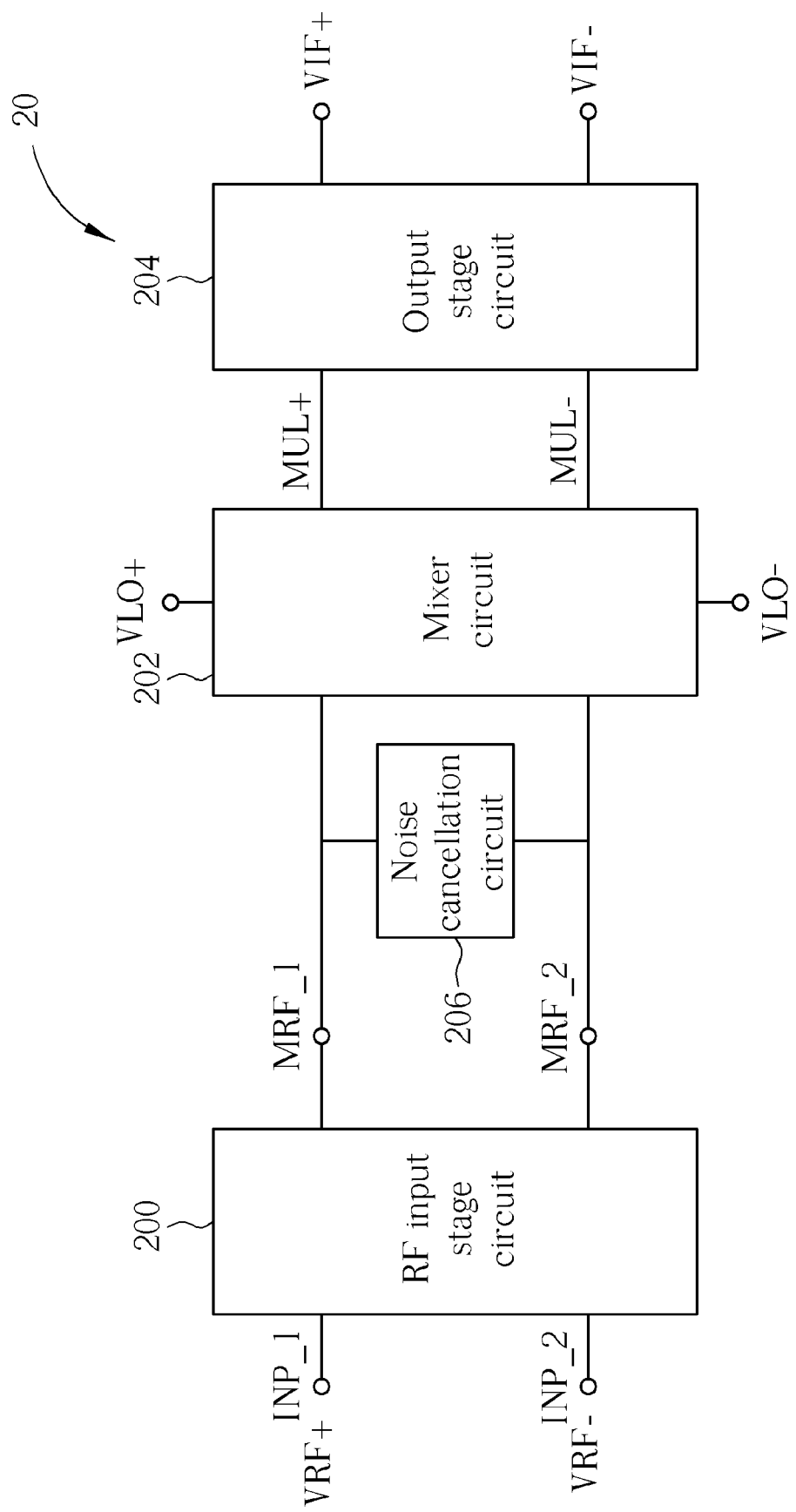
FIG. 2 illustrates a mixer of an embodiment of the present invention.

Please refer to FIG. 2, which illustrates a mixer 20 of an embodiment of the present invention. The mixer device 20 can reduce flicker noise, and comprises an RF input stage circuit 200, a mixer circuit 202, an output stage circuit 204 and a noise cancellation circuit 206. The RF input stage circuit 200 comprises a first input terminal INP_1, a second input terminal INP_2, a first output terminal MRF_1 and a second output terminal MRF_2, and the first input terminal INP_1 and the second input terminal INP_2 is used for receiving a differential RF (radio frequency) signal VRF+ and VRF−, and outputting the front stage differential signal IRF+ and IRF− via the first output terminal MRF_1 and the second output terminal MRF_2. The mixer circuit 202 is coupled to the first output terminal MRF_1 and the second output terminal MRF_2, and is used for receiving the front stage differential signals IRF+ and IRF−, and performing the multiplication operation between the front stage differential signals IRF+ and IRF− and the differential LO (local oscillation) signals VLO+ and VLO−, and outputs the differential MUL (multiplication) signal MUL+ and MUL−. The output stage circuit 204 is coupled to the mixer circuit 202, and is used for generating the differential low frequency signal VIF+ and VIF− according to the differential MUL signal MUL+ and MUL−. The noise cancellation circuit 206 is coupled between the RF input stage circuit 200 and the mixer circuit 202, and is used for adjusting the phase of the flicker noise in the front stage differential signal IRF+ and IRF−, such that the influence of the flicker noise to the differential low frequency signal VIF+ and VIF− can be minimized.

Briefly speaking, in the mixer device 20, the noise cancellation circuit 206 changes the phase of the front stage differential signal IRF+ and IRF−, such that the flicker noise in the front stage differential signal IRF+ and IRF− becomes com-mode mode component. Therefore, the flicker noise can be reduced by the operation of subtraction.

Figure 3:
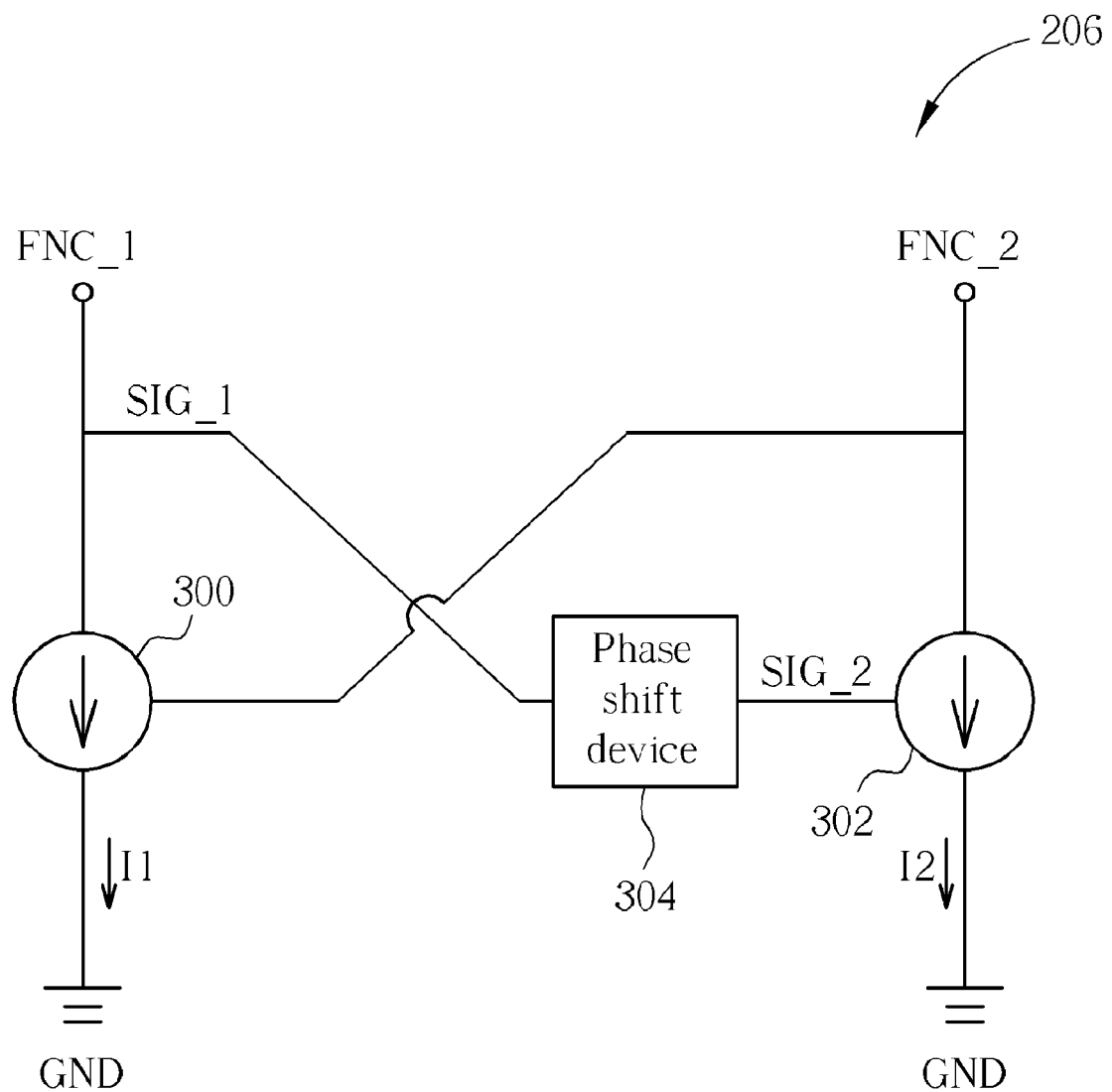
FIG. 3 illustrates the schematic diagram of the noise cancellation circuit of the present invention.

About the methods of the realization of the noise cancellation circuit 206, please continue to refer to FIG. 3, which illustrates the schematic diagram of the noise cancellation circuit 206. The noise cancellation circuit 206 comprises a first signal terminal FNC_1, a second signal end FNC_2, a first variable current 300, a second variable current source 302 and a phase shift device 304. The first signal terminal FNC_1 and the second signal end FNC_2 are respectively coupled to the first output terminal MRF_1 and the second output terminal MRF_2 of the RF input stage circuit 200, and are used for receiving the front stage differential signal IRF+ and IRF−. The phase shift device 304 is coupled between the first signal terminal FNC_1 and the second signal end FNC_2, and is used for transforming the first signal SIG_1 in the first signal terminal FNC_1 to the second signal SIG_2, and outputs the second signal SIG_2 to the second variable current source 302. The first variable current 300 is coupled to the first signal terminal FNC_1, the second signal end FNC_2 and a ground end GND, and is used for switching the magnitude of a current I1 according to the signal in the second signal end FNC_2. The second variable current source 302 is coupled to the second signal end FNC_2, the phase shift device 304 and the ground end GND, and is used for switching the magnitude of a current I2 according to the signal SIG_2 outputting from the phase shift device 304.

Inside the noise cancellation circuit 206, preferably, the phase shift device 304 transforms the phase of the first signal SIG_1 to generate the second signal SIG_2, such that the phase of SIG_2 is conjugate with the phase of the first signal SIG_1, the phase difference can be approximately 90° or 270°. Under this condition, the phase difference between the first signal terminal FNC_1 and the second signal end FNC_2 was made to be 180°, once the noise cancellation circuit 206 operates in a steady state. In other words, the flicker noise in the front stage differential signals IRF+ and IRF− is forced to become common mode components in the signals, which is then cancelled by the following subtraction operation.

Figure 4:
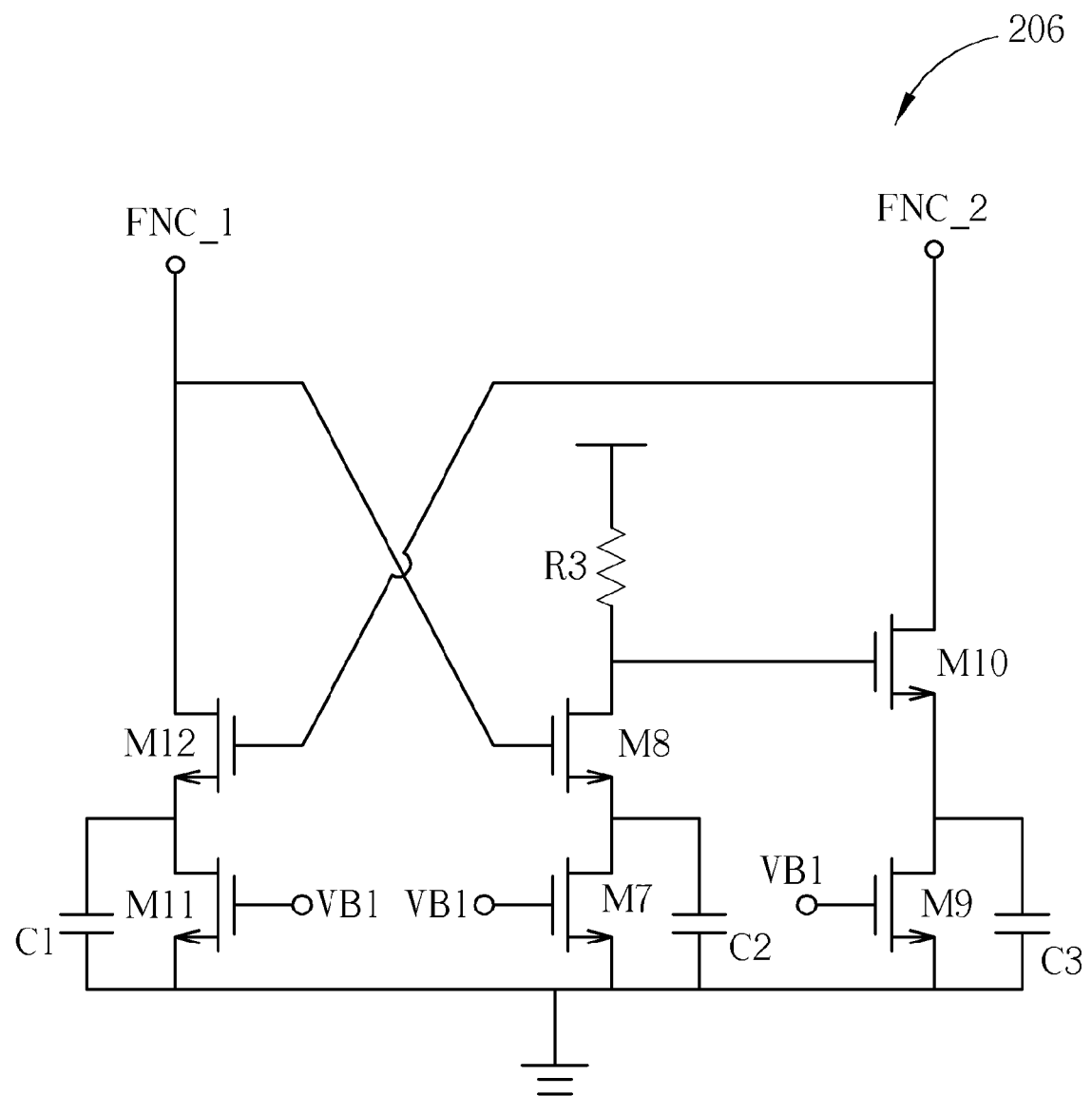
FIG. 4 illustrates the schematic diagram of a noise cancellation circuit of a preferred embodiment of the present invention.

Noticeably, FIG. 3 illustrates the schematic diagram of a noise cancellation circuit 206 of an embodiment of the present invention. Those skilled in the art will readily observe that numerous modifications and alterations may be made. For example, please refer to FIG. 4, which illustrates the schematic diagram of a noise cancellation circuit 206 of a preferred embodiment of the present invention. In FIG. 4, the first variable current source 300 of the noise cancellation circuit 206 is composed of the n-type MOSFET M11 and M12, and a bypass capacitor C1. The n-type MOSFET M12 functions as a current gain switch, and is used to control the magnitude of the current I1. The n-type MOSFET M11 and the bypass capacitor C1 constitute a current source; by using a voltage VB1 provided by a voltage generator (not shown in FIG. 4), a proper operating current can be supplied to the n-type MOSFET M12. In FIG. 4, the second variable current source 302 is composed of the n-type MOSFET M9 and M10, and a bypass capacitor C3, and has the same structure as the first variable current source 300, and won't be detailed further.

On the other hand, in FIG. 4, the phase shift device 304 comprises two n-type MOSFET (M7 and M8), a bypass capacitor C2 and a resistor R3. The n-type transistor M8 and the resistor R3 is used for doing the phase shift operation to the first signal SIG_1, such that the phase of the first signal SIG_1 is approximately conjugate to the second signal SIG_2. The n-type MOSFET M7 and the bypass capacitor C2 can form a current source to supply the n-type MOSFET M8 a proper current source. The functions of the current source are identical to the n-type MOSFET M11 and the bypass capacitor C1 in the first variable current source 300 or the n-type MOSFET M9 and the bypass capacitor C3 in the second variable current source 302, and won't be detailed further.

Therefore, by using the noise cancellation circuit 206 as shown in FIG. 4, the phase shift device 304 can transfer the phase of the first signal SIG_1, such that the phase of the first signal SIG_1 is approximately conjugate to the second signal SIG_2. By this way, while the noise cancellation circuit 206 operates in the steady state, the noise cancellation circuit 206 will reach a state of resonance, and the phase difference between the first signal terminal FNC_1 and the second signal terminal FNC_2 will become about 180°. In other words, the flicker noise exists in the front stage differential signals IRF+ and IRF− can be made to become common mode signals owing to the state of resonance reached by the noise cancellation circuit 206, such that the flicker noise can be eliminated by subtraction.

Figure 1:
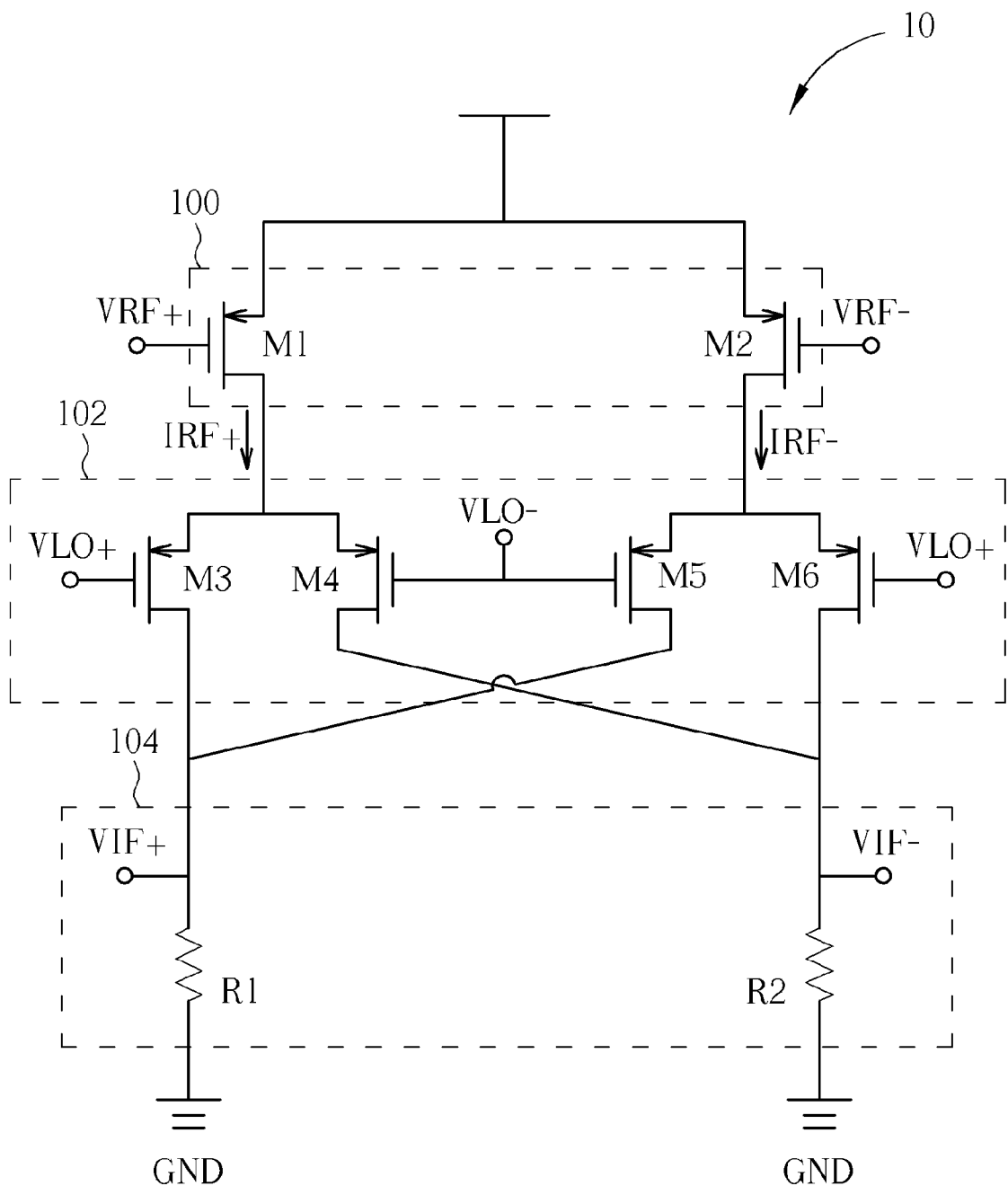
FIG. 1 illustrates a Gilbert double-balanced mixer according to the prior art.
Figure 5:
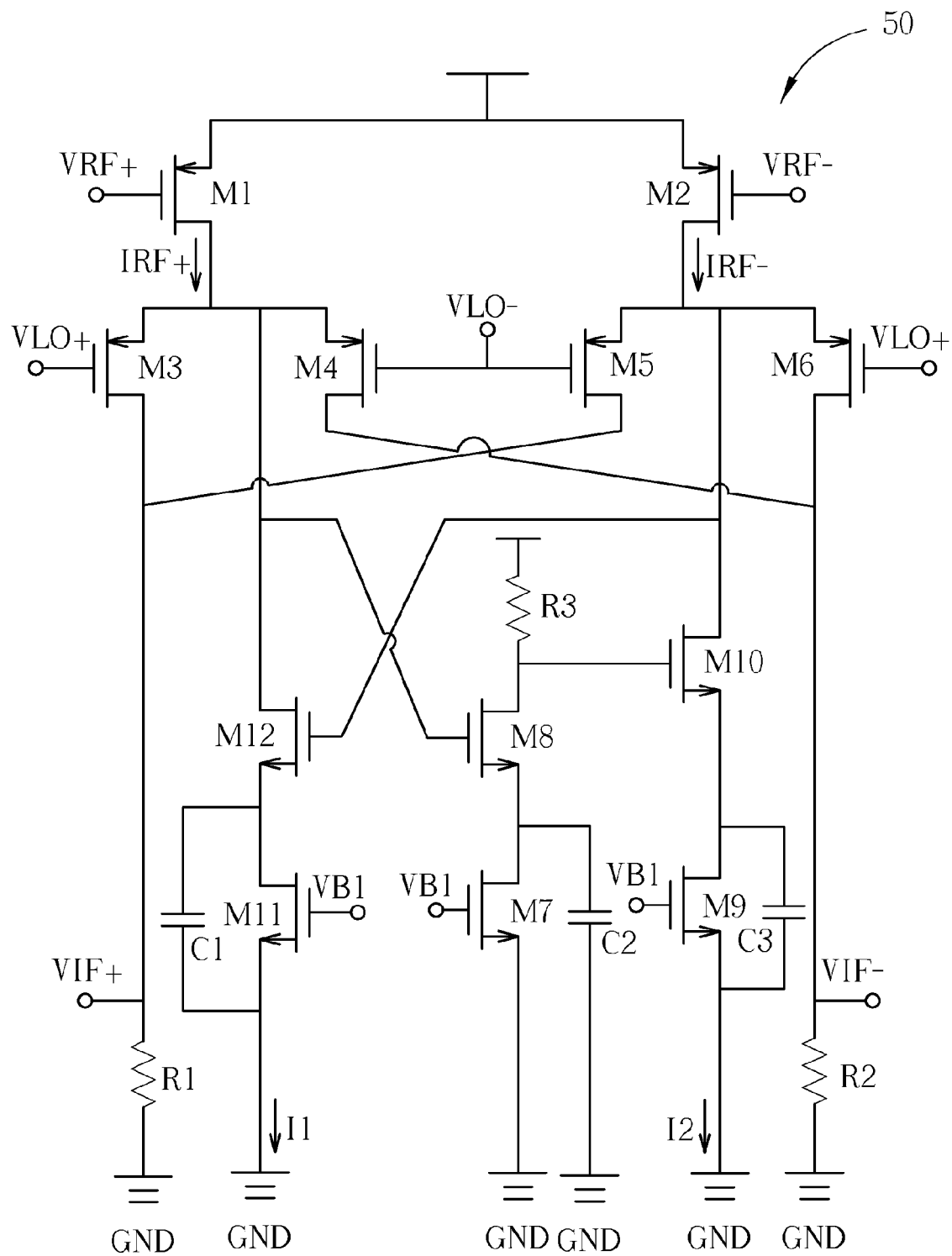
FIG. 5 illustrates the schematic diagram of a mixer device of an embodiment of the present invention.

FIG. 2, the RF input stage circuit 200, the mixer circuit 202 and the output stage circuit 204 jointly constitute the basic structure of the mixer device 20, and it can be any mixer of relevant structure adopted from the prior art, such as the Gilbert double-balanced mixer 10 shown in FIG. 1. For example, please refer to FIG. 5, which illustrates the schematic diagram of a mixer device 50 of an embodiment of the present invention. The mixer device 50 is the combination of the Gilbert double-balanced mixer as shown in FIG. 1 and the noise cancellation circuit 206 shown in FIG. 4. Therefore, for clearly explaining the operating principles of the mixer device 50, FIG. 5 adopts the symbols and their definitions used in FIG. 1 and FIG. 4. In FIG. 5, the n-type MOSFET M12 couples its drain to the drain of the field effect transistor M1 and the source of the field effect transistors M3 and M4; the n-type MOSFET M12 connects its gate to the drain of the field effect transistor M2 and the source of the field effect transistors M5 and M6; the n-type MOSFET M10 connects its drain to the drain of the field effect transistor M2 and the source of the field effect transistors M5 and M6; the n-type MOSFET M8 connects its gate to the drain of the field effect transistor M1 and the source of the field effect transistors M3 and M4.

The operation of the mixer device 50 is stated as follows: First, the field effect transistors M1 and M2 receives differential RF signal (VRF+ and VRF−), and transforms to the differential current signal (IRF+ and IRF−), and used for controlling the gain of the field effect transistors (M3-M6), such that the field effect transistors (M3-M6) can perform the multiplication operation between the differential current signal (IRF+ and IRF−) and the differential LO signal (VLO+ and VLO−), and output the differential multiplication signal (MUL+ and MUL−). Meanwhile, the noise cancellation circuit 206 can work in a steady state of resonance, such that the flicker noise generated in the source of the transistors (M3-M6) presents itself as a common mode component in the differential multiplication signal MUL+ and MUL−. Finally, the resistors R1 and R2 transform the differential multiplication signal MUL+ and MUL− into the differential low frequency signal VIF+ and VIF−. In other words, the flicker noise in the front stage differential signal IRF+ and IRF− can be made to become common mode signals, such that the flicker noise can be eliminated by subtraction, and increase the signal-to-noise ratio of the output signal.

Figure 6:
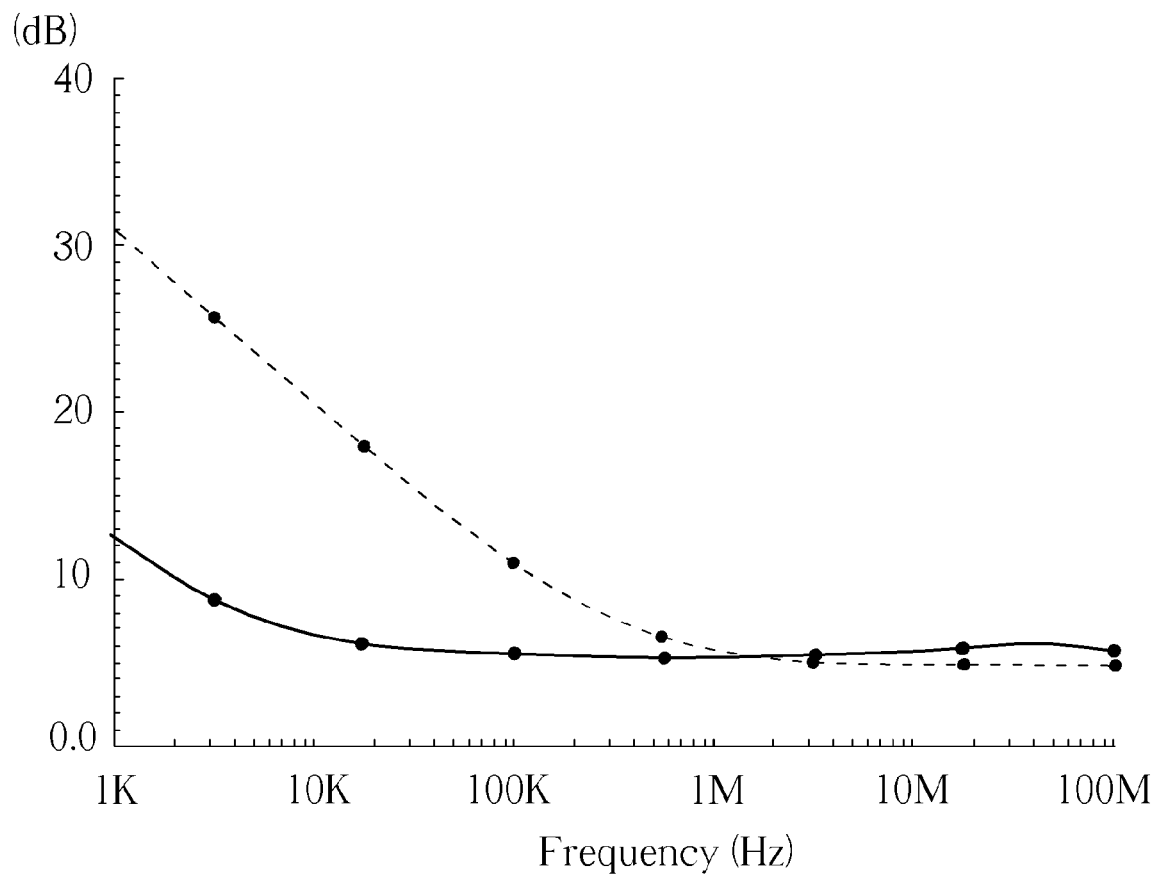
FIG. 6 illustrates the diagram of the noise figure.
Figure 7:
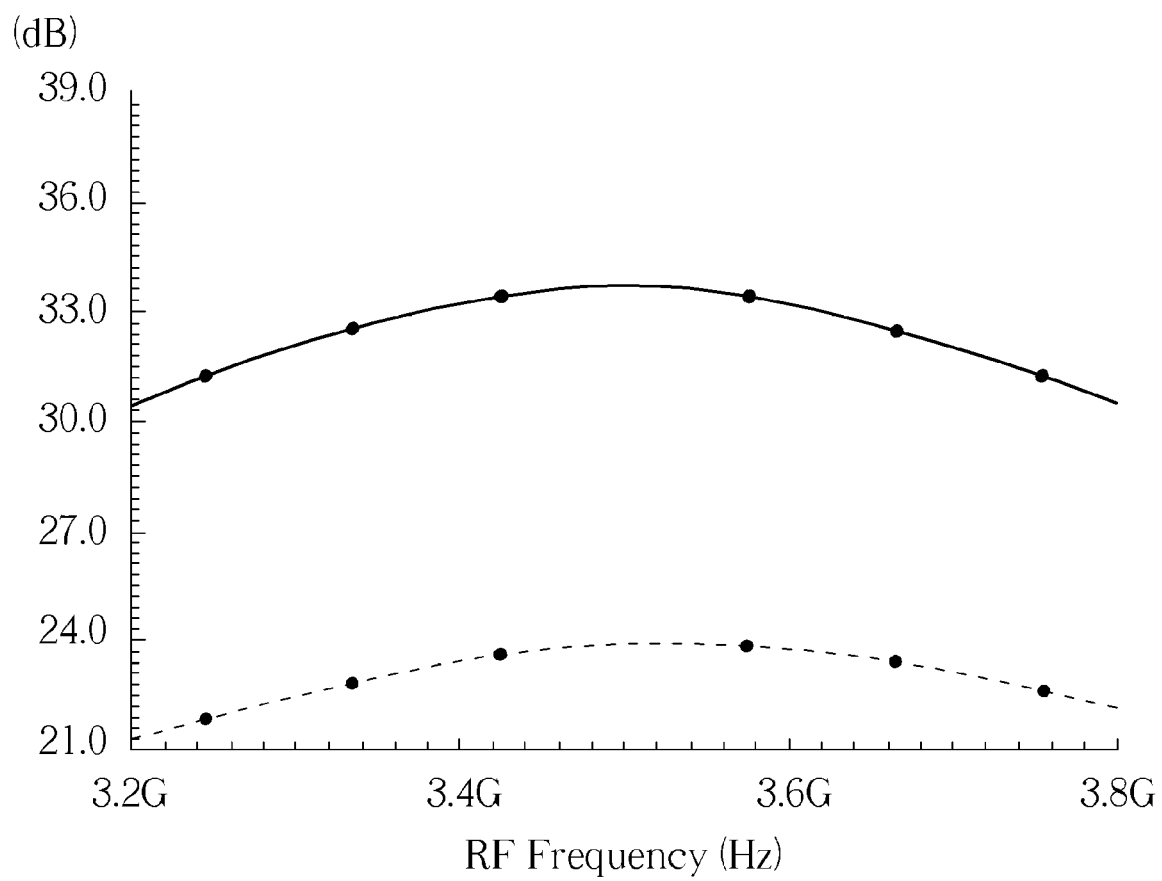
FIG. 7 illustrates the diagram of the voltage gain.

For clearly comparing the difference between the mixer device 50 and the Gilbert double-balanced mixer 10, please continue to refer to FIG. 6 and FIG. 7. FIG. 6 illustrates the diagram of the noise figure, and FIG. 7 illustrates the diagram of the voltage gain. In FIG. 6, the solid curve corresponds to the noise figure of the mixer device 50, and the dashed curve corresponds to the noise figure of the Gilbert double-balanced mixer 10. In FIG. 7, the solid curve corresponds to the voltage gain of the mixer device 50, and the dashed curve corresponds to the voltage gain of the Gilbert double-balanced mixer 10. As shown in FIG. 6, the performance of the present invention is generally superior to that of the prior art; for example, the noise figure of the mixer device 50 in the frequency of 10 KHz is 6.7 dB, but the noise figure of the prior art in the same frequency is 20.5 dB. That is to say, the noise figure of the present invention is reduced by 13.8 dB in 10 KHz. Similarly, about the noise figure, the integrated noise of the mixer device 50 in the frequency range starting from 1 KHz to 10 MHz is 5.23 dB, and is 5.47 dB for the Gilbert double-balanced mixer 10, and the present invention reduces the integrated noise figure by 0.24 dB. As shown in FIG. 7, the voltage gain of the mixer device 50 is better than the Gilbert double-balanced mixer 10 by about 9.8 dB. Therefore, the present invention is better than the prior art both in the noise figure of the low frequency domain and the voltage gain. On the other hand, the operating current of the mixer device 10 plus the front-end low noise amplifier (LNA) is totally measured as 7.53 mA, and the Gilbert double-balanced mixer 10 plus the LNA is measured as 7.03 mA. The current consumption of the present invention is larger than the prior art by 0.5 mA. The above results are done by measuring the working samples made by the TSMC 0.18 µm process. The operating voltage of the sample is 1.8 volt.

Figure 8:
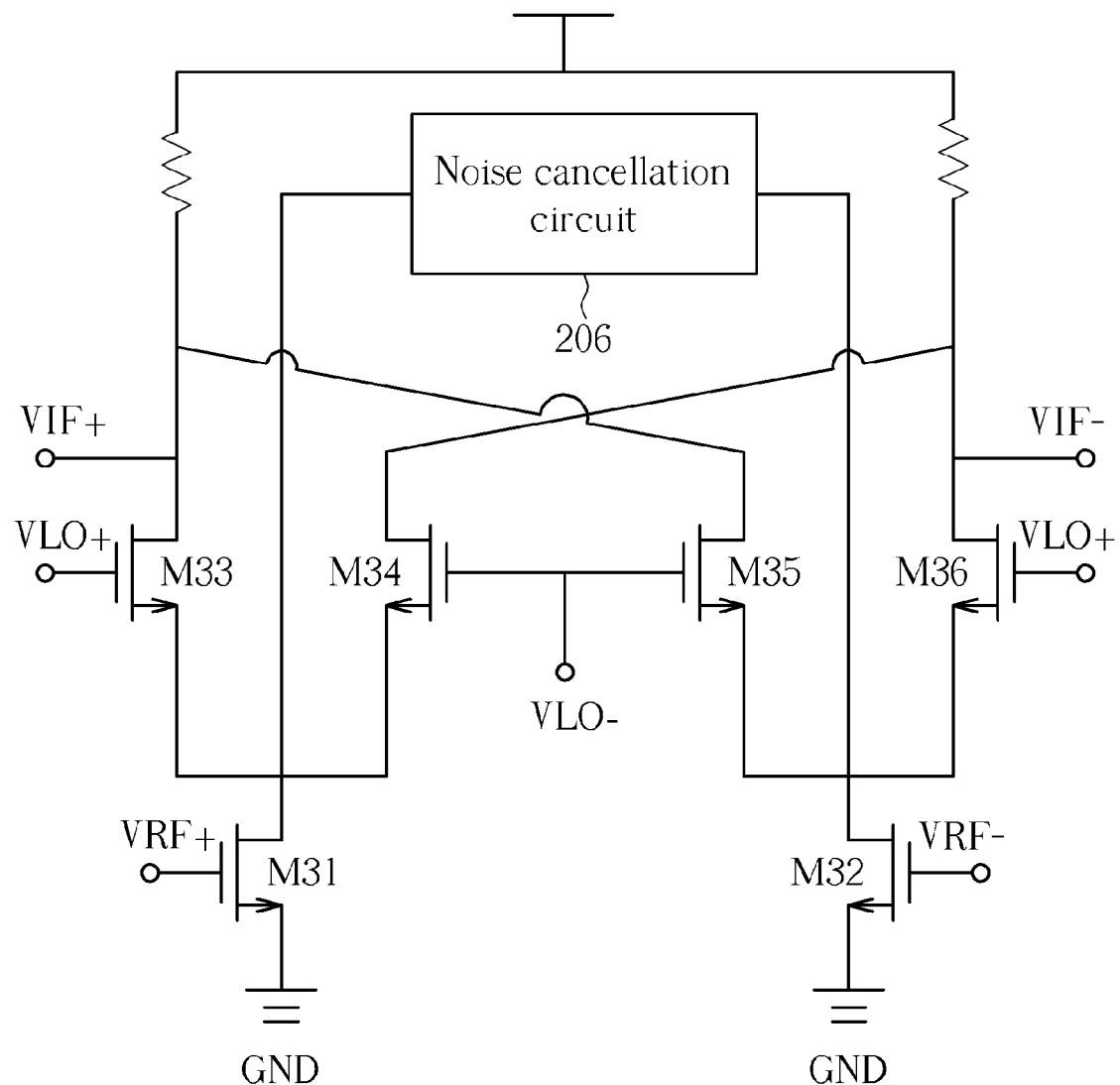
FIG. 8 to FIG. 13 illustrate the schematic diagram of a mixer device of a compatible embodiment of the present invention.
Figure 9:
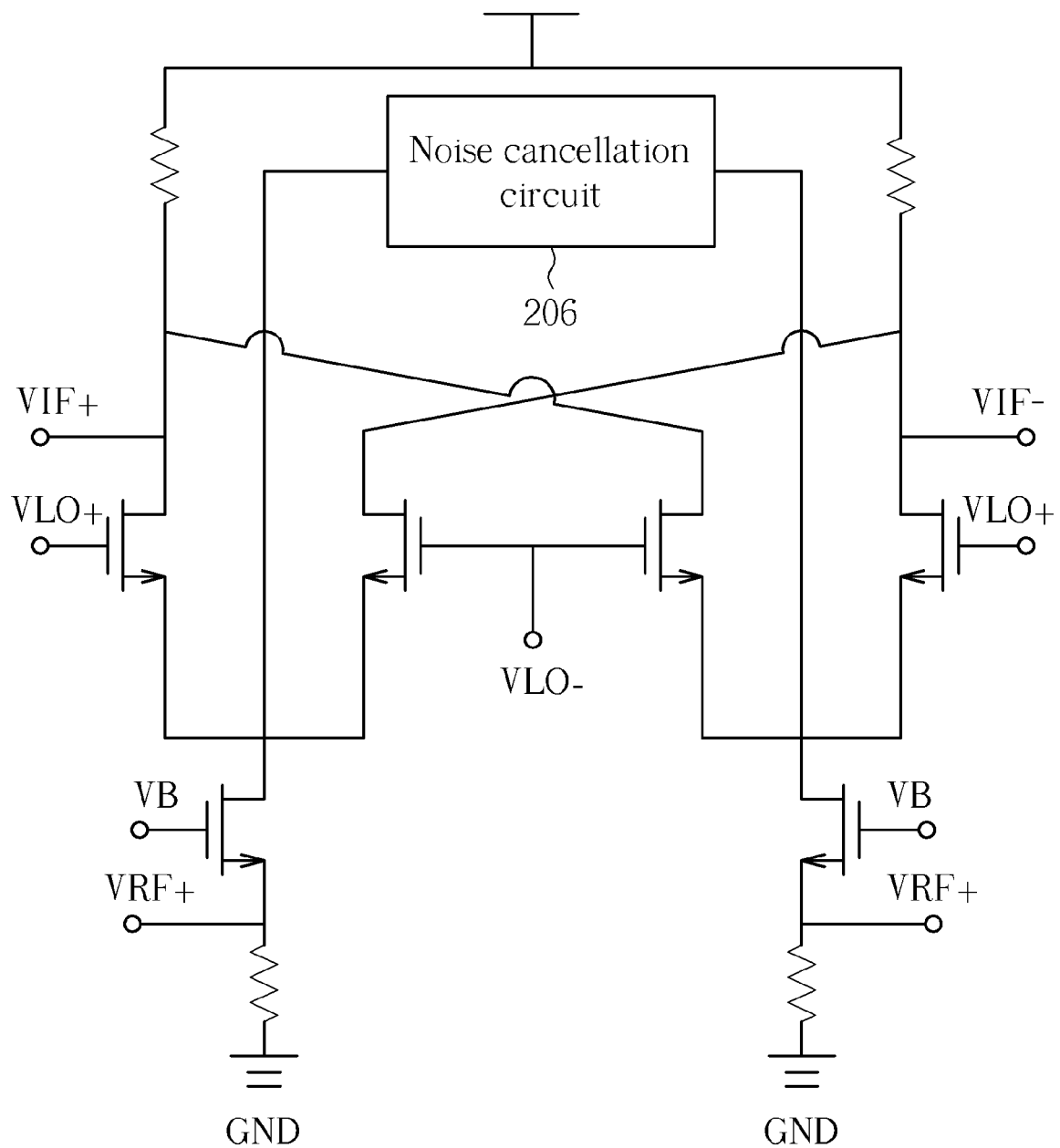
Figure 10:
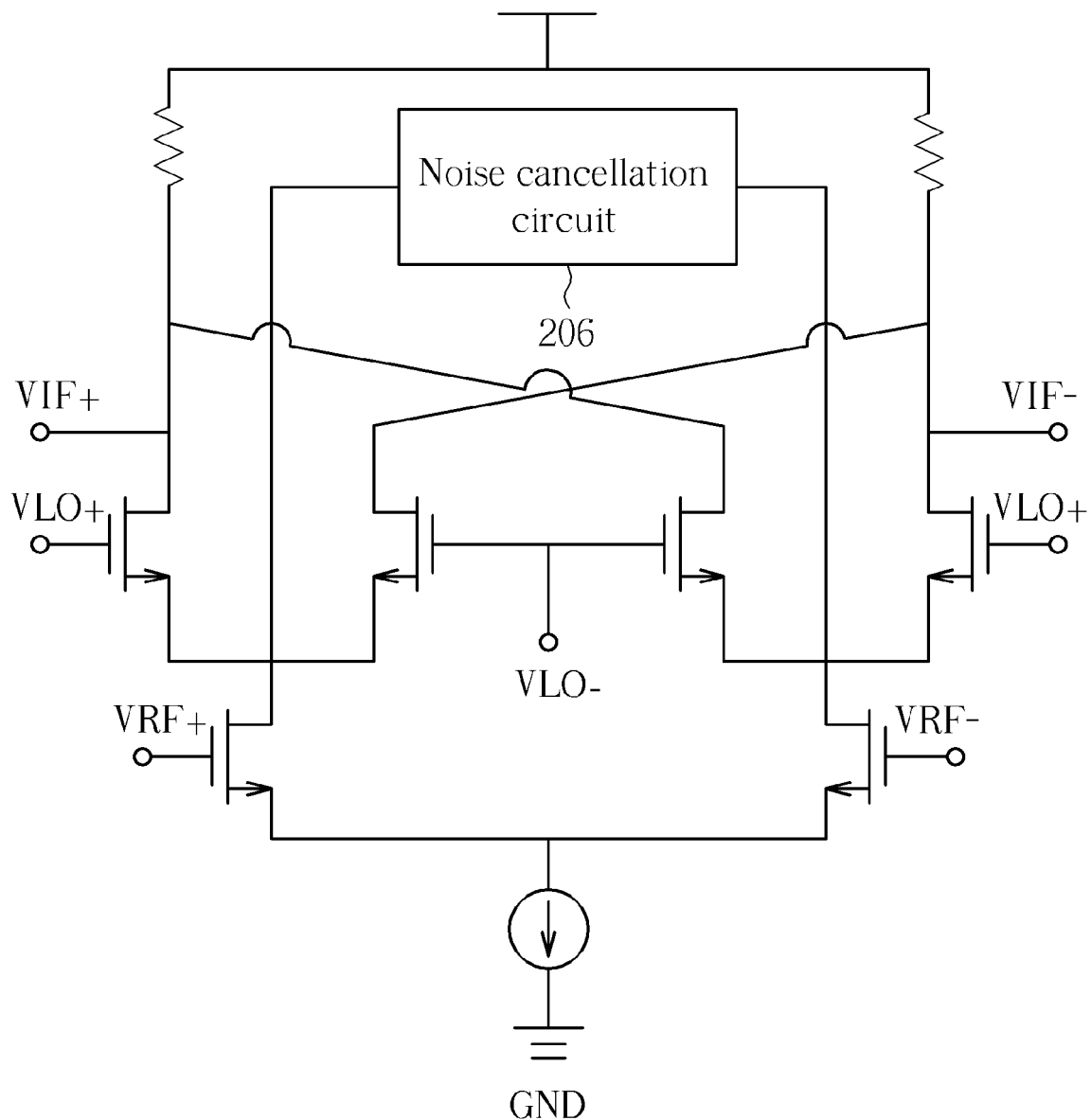
Figure 11:
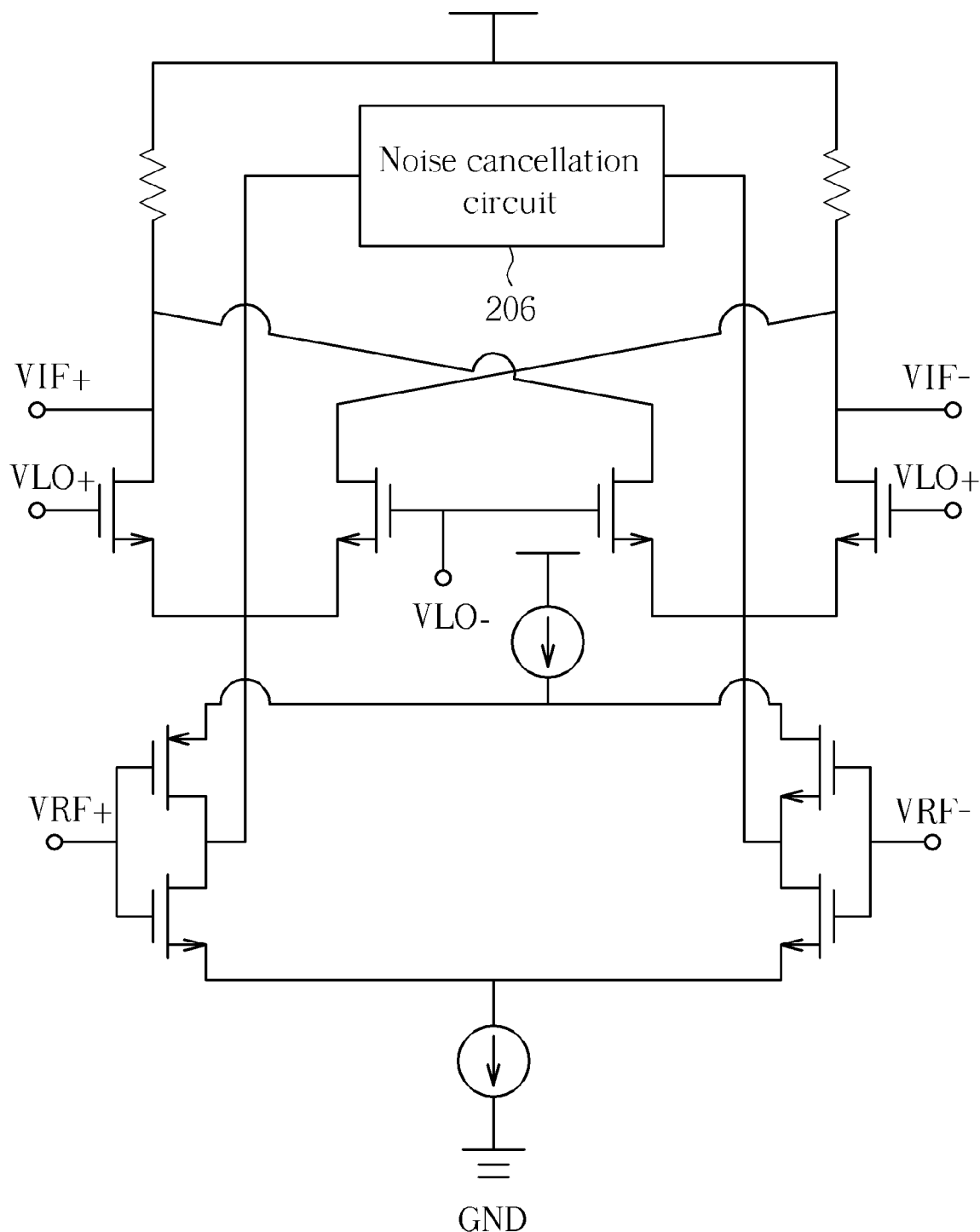
Figure 12:
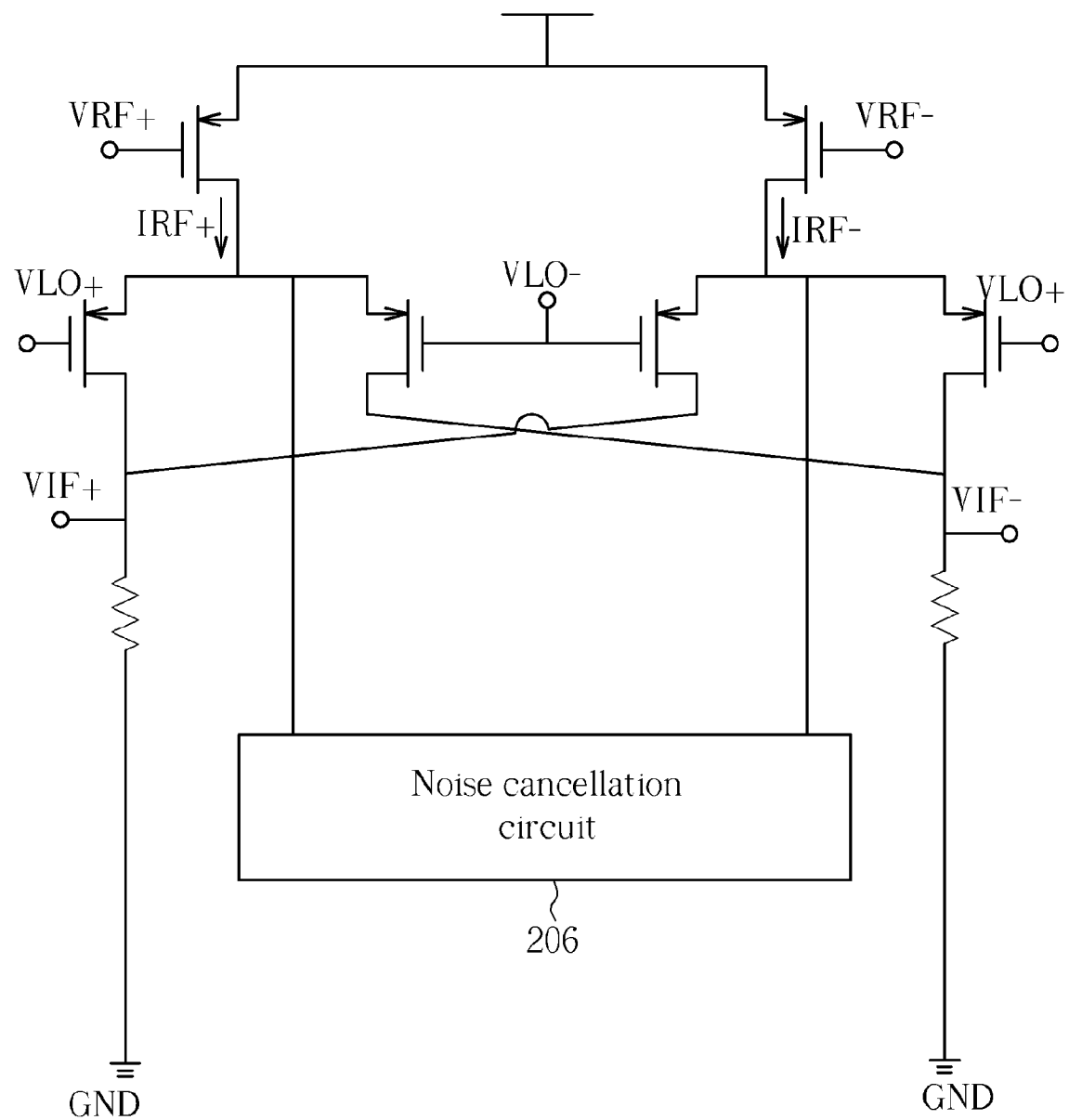
Figure 13:
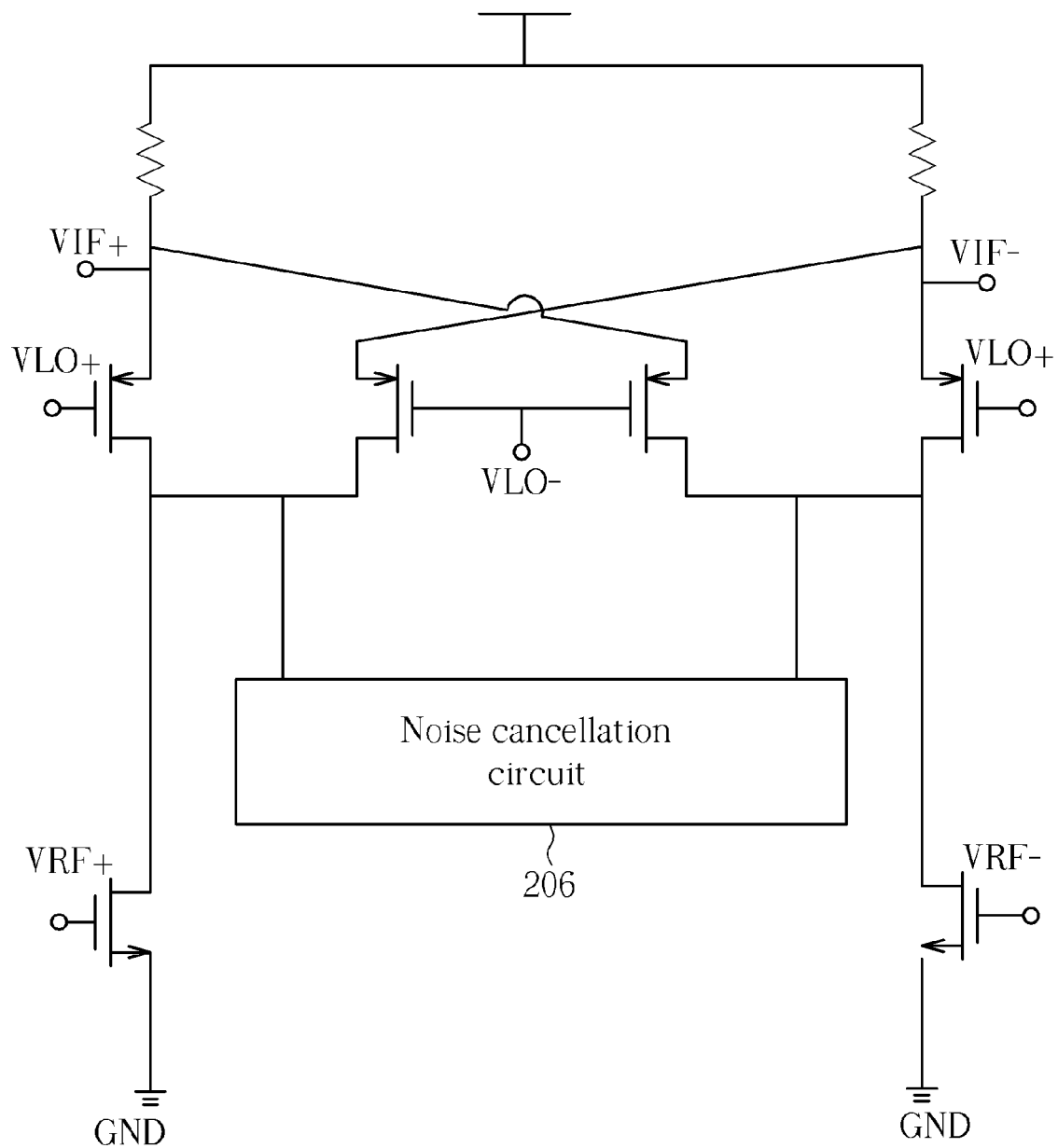

Therefore, by using the noise cancellation circuit 206, the flicker noise existing in the front stage differential signal IRF+ and IRF− can be made to become common mode component, such that the flicker noise can be eliminated by applying the subtraction operation to the differential output of the mixer device 50. Noticeably, the mixer device 50 can be equally expressed as the combination of the Gilbert double-balanced mixer and the noise cancellation circuit 206 in FIG. 4. Certainly, the noise cancellation circuit 206 can be applied further to various types of mixer devices, and not only limited to the case shown in FIG. 5. For example, in the mixer device 50, the Gilbert double-balanced mixer is composed of the p-type MOSFET (M1-M6); however, the mixer can be composed of n-type MOSFET (M31-M36) as shown in FIG. 8. Meanwhile, besides the example depicted in FIG. 8, the noise cancellation circuit 206 can also be applied to different types of mixer devices, as shown in FIG. 9 to FIG. 13. Also, from FIG. 8 to FIG. 11, the differential RF signal VRF+ and VRF− can be input to the mixer device 50 in several different configurations. FIG. 8 illustrates the configuration of the common source input stage to input the differential RF signal VRF+ and VRF−. FIG. 9 illustrates the configuration of the common gate input stage to input the differential RF signal VRF+ and VRF−, which has relatively smaller gain, but better performance in the input stage gain's linearity and input signals' isolation (between the differential RF signal, VRF+ and VRF−, and the differential LO signal, LO+ and LO−. FIG. 10 illustrates another configuration of the common source input stage with an extra bias current, compared with FIG. 8. FIG. 11 illustrates the configuration of the complementary input stage, wherein the differential RF signal VRF+ and VRF− is amplified by the complementary MOS (CMOS) amplifiers to supply gains for the input differential signal, and have a so-called "current steering" effect. The working principles of the rest of the mixer devices should be clear to the people who have common skills in the art.

Figure 14:
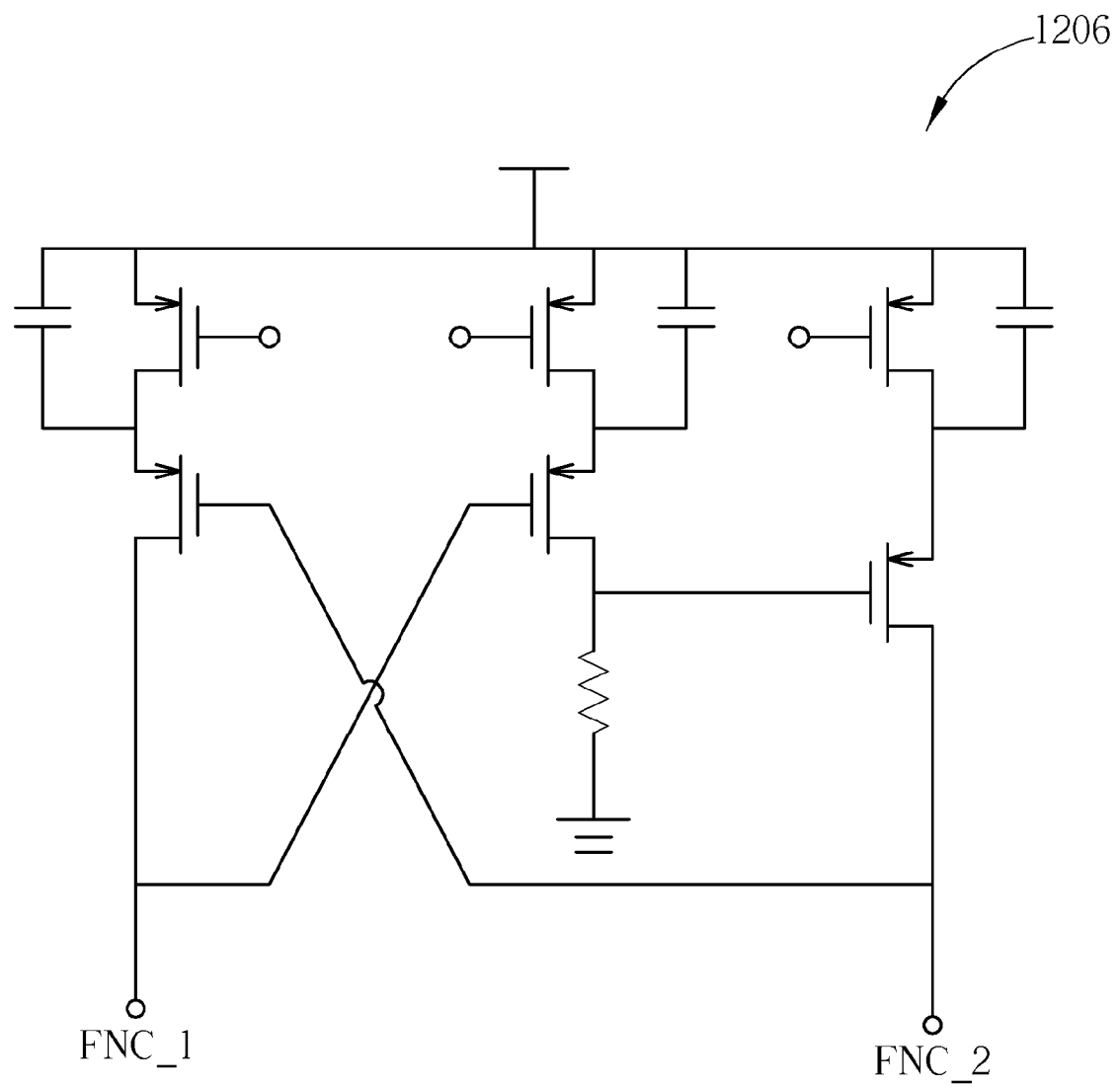
FIG. 14 illustrates an embodiment of the noise cancellation circuit of the present invention.

On the other hand, in FIG. 3 and FIG. 4, the noise cancellation circuit 206 originally comprises the n-type MOSFET, and it can also be made of the p-type MOSFET, as shown in FIG. 14. FIG. 14 illustrates an embodiment of the noise cancellation circuit 1206 of the present invention. Comparing FIG. 14 to FIG. 4, the main difference is about the type of MOSFET being used, and the circuit structure and the operating principles are similar; therefore, their usages can be induced by the people with common skills in this art, and won't be detailed further. Similarly, the noise cancellation circuit 1206 can substitute the noise cancellation circuit 206, and apply to the related mixer devices, such as the one illustrated in FIG. 5, or from FIG. 8 to FIG. 13.

As mentioned above, the flicker noise greatly reduces the signal-to-noise ratio of the receiver circuit, badly damages the system performance, and is unable to be removed by ordinary filter technique. Meanwhile, the spectral distribution of the flicker noise is approximately inversely proportional to the frequency. The energy level of the flicker noise becomes larger as the frequency gets closer to the direct current, such that the low frequency signals are easily immersed in the flicker noise. Under these circumstances, the present invention changes the phase of the flicker noise in the front stage differential signal, such that the flicker noise become common mode component in the mixer's output differential signal, and can be eliminated by subtraction. The present invention can effectively reduce the influence of the flicker noise to the real signal, elevate the quality of the receiving signal, and decrease the error rate of the receiving information.

To make a summary, the present invention uses a signal phase shift method to make the flicker noise of the mixer device become common mode component in the differential output signal, such that the flicker noise can be eliminated by subtraction, and the signal-to-noise ratio and the total performance of the communication system can be greatly improved.

Those skilled in the art will readily observe that numerous modifications and alterations of the device and method may be made while retaining the teachings of the invention.

What is claimed is:

1. A noise cancellation circuit for a mixer device comprising:
   a first signal terminal, coupled to a first output terminal of an RF input stage of the mixer device;
   a second signal terminal, coupled to a second output terminal of the RF input stage of the mixer device;
   a first variable current source comprising a first end coupled to the first signal terminal, a second end coupled to the second signal terminal, and a third end coupled to a first voltage source, for adjusting current between the first end to the third end according to signals of the second end;
   a second variable current source comprising a first end coupled to the second signal terminal, a second end, and a third end coupled to the first voltage source, for adjusting current between the first end to the third end according to signals of the second end; and
   a phase shift device coupled between the first signal terminal and the second end of the second variable current source, for transforming a first signal into a second signal, and outputting the second signal to the second end of the second variable current source.

2. The noise cancellation circuit of claim 1, wherein the first variable current source comprises:
   a current gain switch comprising a first end coupled to the first signal terminal, a second end coupled to the second signal terminal, and a third end, the current gain switch for conducting the signal connection between the first end and the third end according to the signals presented in the second end; and
   a current source, coupled between the third end of the current gain switch and the first voltage source, for supplying current.

3. The noise cancellation circuit of claim 2, wherein the current source comprises:
   a voltage generator for generating a voltage;
   a transistor comprising a drain coupled to the third end of the current gain switch, a gate coupled to the voltage generator, and a source coupled to the first voltage source; and
   a bypass capacitor, coupled between the third end of the current gain switch and the first voltage source.

4. The noise cancellation circuit of claim 3, wherein the first voltage source is a low voltage source.

5. The noise cancellation circuit of claim 4, wherein the current gain switch is an n-type MOSFET, the first end is a drain, the second end is a gate, and the third end is a source.

6. The noise cancellation circuit of claim 4, wherein the transistor of the current source is an n-type MOSFET.

7. The noise cancellation circuit of claim 3, wherein the first voltage source is a high voltage source.

8. The noise cancellation circuit of claim 7, wherein the current gain switch is a p-type MOSFET, the first end is a drain, the second end is a gate, and the third end is a source.

9. The noise cancellation circuit of claim 7, wherein the transistor of the current source is a p-type MOSFET.

10. The noise cancellation circuit of claim 1, wherein the second variable current source comprises:
    a current gain switch, comprising a first end coupled to the second signal terminal, a second end coupled to the phase shift device, and a third end, the current gain switch for conducting the signal connection between the first end and the third end according to the signals presented in the second end; and
    a current source, coupled between the third end of the current gain switch and the first voltage source, for supplying current.

11. The noise cancellation circuit of claim 10, wherein the current source comprises:
    a voltage generator for generating a voltage;
    a transistor with a drain coupled to the third end of the current gain switch, a gate coupled to the voltage generator, and a source coupled to the first voltage source; and
    a bypass capacitor, coupled between the third end of the current gain switch and the first voltage source.

12. The noise cancellation circuit of claim 11, wherein the first voltage source is a low voltage source.

13. The noise cancellation circuit of claim 12, wherein the current gain switch is an n-type MOSFET, the first end is a drain, the second end is a gate, and the third end is a source.

14. The noise cancellation circuit of claim 12, wherein the transistor of the current source is an n-type MOSFET.

15. The noise cancellation circuit of claim 11, wherein the first voltage source is a high voltage source.

16. The noise cancellation circuit of claim 15, wherein the current gain switch is a p-type MOSFET, the first end is a drain, the second end is a gate, and the third end is a source.

17. The noise cancellation circuit of claim 15, wherein the transistor of the current source is a p-type MOSFET.

18. The noise cancellation circuit of claim 1, wherein the phase shift device comprises:
    a resistor, having one end coupled to a second voltage source, and another end coupled to the second variable current source;
    a current gain switch, comprising a first end coupled to the second variable current source, a second end coupled to the first signal terminal, and a third end, the current gain switch for conducting the signal connection between the first end and the third end according to the signals presented in the second end; and a current source, coupled between the third end of the current gain switch and the first voltage source, for supplying current.

19. The noise cancellation circuit of claim 18, wherein the current source comprises:
   a voltage generator for generating a voltage;
   a transistor comprising a drain coupled to the third end of the current gain switch, a gate coupled to the voltage generator, and a source coupled to the first voltage source; and
   a bypass capacitor coupled between the third end of the current gain switch and the first voltage source.

20. The noise cancellation circuit of claim 19, wherein the first voltage source is a low voltage source and the second source is a high voltage source.

21. The noise cancellation circuit of claim 20, wherein the current gain switch is an n-type MOSFET, the first end is a drain, the second end is a gate, and the third end is a source.

22. The noise cancellation circuit of claim 20, wherein the transistor of the current source is an n-type MOSFET.

23. The noise cancellation circuit of claim 19, wherein the first voltage source is a high voltage source and the second source is a low voltage source.

24. The noise cancellation circuit of claim 23, wherein the current gain switch is a p-type MOSFET, the first end is a drain, the second end is a gate, and the third end is a source.

25. The noise cancellation circuit of claim 23, wherein the transistor of the current source is a p-type MOSFET.

26. The noise cancellation circuit of claim 1, wherein the phase difference between the first signal and the second signal is a certain degree of phase angle.

27. The noise cancellation circuit of claim 26, wherein the certain degree is approximately 90°.

28. The noise cancellation circuit of claim 26, wherein the certain degree is approximately −270°.

29. A mixer device capable of reducing the noise comprising:
   an RF input stage, comprising a first input terminal, a second input terminal, a first output terminal and a second output terminal, for receiving a differential input signal, and outputting the front stage differential signals via the first output terminal and the second output terminal;
   a mixer circuit, coupled to the first output terminal and the second output terminal, for receiving the front stage signals, and performing the multiplication operation between the front stage differential signal and the differential oscillation signal, and outputting a differential multiplication signal;
   an output stage coupled to the mixer circuit, for generating a differential low frequency signal according to the differential multiplication signal; and
   a noise cancellation circuit comprising:
      a first signal terminal, coupled to a first output terminal of an RF input stage of the mixer device;
      a second signal terminal, coupled to a second output terminal of the RF input stage of the mixer device;
      a first variable current source comprising a first end coupled to the first signal terminal, a second end coupled to the second signal terminal, and a third end coupled to a first voltage source, for adjusting current between the first end to the third end according to signals of the second end;
      a second variable current source comprising a first end coupled to the second signal terminal, a second end, and a third end coupled to the first voltage source, for adjusting current between the first end to the third end according to signals of the second end; and
      a phase shift device coupled between the first signal terminal and the second end of the second variable current source, for transforming a first signal into a second signal, and outputting the second signal to the second end of the second variable current.

30. The noise cancellation circuit of claim 29, wherein the first variable current source comprises:
   a current gain switch comprising a first end coupled to the first signal terminal, a second end coupled to the second signal terminal, and a third end, the current gain switch for conducting the signal connection between the first end and the third end according to the signals presented in the second end; and
   a current source, coupled between the third end of the current gain switch and the first voltage source, for supplying current.

31. The noise cancellation circuit of claim 30, wherein the current source comprises:
   a voltage generator for generating a voltage;
   a transistor comprising a drain coupled to the third end of the current gain switch, a gate coupled to the voltage generator, and a source coupled to the first voltage source; and
   a bypass capacitor, coupled between the third end of the current gain switch and the first voltage source.

32. The noise cancellation circuit of claim 31, wherein the first voltage source is a low voltage source.

33. The noise cancellation circuit of claim 32, wherein the current gain switch is an n-type MOSFET, the first end is a drain, the second end is a gate, and the third end is a source.

34. The noise cancellation circuit of claim 32, wherein the transistor of the current source is an n-type MOSFET.

35. The noise cancellation circuit of claim 31, wherein the first voltage source is a high voltage source.

36. The noise cancellation circuit of claim 35, wherein the current gain switch is a p-type MOSFET, the first end is a drain, the second end is a gate, and the third end is a source.

37. The noise cancellation circuit of claim 35, wherein the transistor of the current source is a p-type MOSFET.

38. The noise cancellation circuit of claim 29, wherein the second variable current source comprises:
   a current gain switch, comprising a first end coupled to the second signal terminal, a second end coupled to the phase shift device, and a third end, the current gain switch for conducting the signal connection between the first end and the third end according to the signals presented in the second end; and
   a current source, coupled between the third end of the current gain switch and the first voltage source, for supplying current.

39. The noise cancellation circuit of claim 38, wherein the current source comprises:
   a voltage generator for generating a voltage;
   a transistor with a drain coupled to the third end of the current gain switch, a gate coupled to the voltage generator, and a source coupled to the first voltage source; and
   a bypass capacitor, coupled between the third end of the current gain switch and the first voltage source.

40. The noise cancellation circuit of claim 39, wherein the first voltage source is a low voltage source.

41. The noise cancellation circuit of claim 40, wherein the current gain switch is an n-type MOSFET, the first end is a drain, the second end is a gate, and the third end is a source.

42. The noise cancellation circuit of claim 40, wherein the transistor of the current source is an n-type MOSFET.

43. The noise cancellation circuit of claim 39, wherein the first voltage source is a high voltage source.

44. The noise cancellation circuit of claim 43, wherein the current gain switch is a p-type MOSFET, the first end is a drain, the second end is a gate, and the third end is a source.

45. The noise cancellation circuit of claim 43, wherein the transistor of the current source is a p-type MOSFET.

46. The noise cancellation circuit of claim 29, wherein the phase shift device comprises:
 a resistor, having one end coupled to a second voltage source, and another end coupled to the second variable current source;
 a current gain switch, comprising a first end coupled to the second variable current source, a second end coupled to the first signal terminal, and a third end, the current gain switch for conducting the signal connection between the first end and the third end according to the signals presented in the second end; and
 a current source, coupled between the third end of the current gain switch and the first voltage source, for supplying current.

47. The noise cancellation circuit of claim 46, wherein the current source comprises:
 a voltage generator for generating a voltage;
 a transistor comprising a drain coupled to the third end of the current gain switch, a gate coupled to the voltage generator, and a source coupled to the first voltage source; and
 a bypass capacitor coupled between the third end of the current gain switch and the first voltage source.

48. The noise cancellation circuit of claim 47, wherein the first voltage source is a low voltage source and the second source is a high voltage source.

49. The noise cancellation circuit of claim 48, wherein the current gain switch is an n-type MOSFET, the first end is a drain, the second end is a gate, and the third end is a source.

50. The noise cancellation circuit of claim 48, wherein the transistor of the current source is an n-type MOSFET.

51. The noise cancellation circuit of claim 47, wherein the first voltage source is a high voltage source and the second source is a low voltage source.

52. The noise cancellation circuit of claim 51, wherein the current gain switch is a p-type MOSFET, the first end is a drain, the second end is a gate, and the third end is a source.

53. The noise cancellation circuit of claim 51, wherein the transistor of the current source is a p-type MOSFET.

54. The noise cancellation circuit of claim 29, wherein the phase difference between the first signal and the second signal is a certain degree of phase angle.

55. The noise cancellation circuit of claim 54, wherein the certain degree is approximately 90°.

56. The noise cancellation circuit of claim 54, wherein the certain degree is approximately −270°.

* * * * *